United States Patent
Jiang et al.

(10) Patent No.: US 9,065,156 B2
(45) Date of Patent: Jun. 23, 2015

(54) PHOTOVOLTAIC CAPACITOR FOR DIRECT SOLAR ENERGY CONVERSION AND STORAGE

(75) Inventors: Hongrui Jiang, Madison, WI (US); Chensha Li, Madison, WI (US); Chi-Wei Lo, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 936 days.

(21) Appl. No.: 13/205,181

(22) Filed: Aug. 8, 2011

(65) Prior Publication Data

US 2013/0038267 A1 Feb. 14, 2013

(51) Int. Cl.
| | |
|---|---|
| H02J 7/00 | (2006.01) |
| H02J 7/14 | (2006.01) |
| H01M 10/46 | (2006.01) |
| H01M 10/44 | (2006.01) |
| H01M 10/052 | (2010.01) |
| H01G 9/20 | (2006.01) |
| H01M 10/0565 | (2010.01) |

(52) U.S. Cl.
CPC ............ *H01M 10/465* (2013.01); *H01M 10/44* (2013.01); *H01M 10/0565* (2013.01); *H01M 10/052* (2013.01); *H01G 9/2045* (2013.01); *Y02E 10/542* (2013.01)

(58) Field of Classification Search
USPC ............ 320/101; 429/15, 209, 246, 304, 303, 429/214, 251; 136/243, 244, 258, 206
See application file for complete search history.

(56) References Cited

U.S. PATENT DOCUMENTS

| | | | |
|---|---|---|---|
| 5,401,330 A * | 3/1995 | Saito et al. ................... 136/259 |
| 6,849,797 B2 * | 2/2005 | Koyanagi et al. ............. 136/256 |
| 6,949,317 B2 | 9/2005 | Yoshida et al. | |
| 7,088,572 B2 | 8/2006 | Yoshida et al. | |
| 7,682,740 B2 * | 3/2010 | Yong et al. ..................... 429/217 |
| 8,299,270 B2 * | 10/2012 | Maruyama ................. 548/314.4 |
| 2002/0061449 A1 | 5/2002 | Maruo et al. | |
| 2003/0188777 A1 * | 10/2003 | Gaudiana et al. ............. 136/263 |
| 2004/0221888 A1 * | 11/2004 | Fukui et al. ................... 136/263 |
| 2004/0241551 A1 | 12/2004 | Nakamura et al. | |
| 2005/0142447 A1 * | 6/2005 | Nakai et al. .............. 429/231.95 |
| 2005/0166957 A1 * | 8/2005 | Imoto et al. ................... 136/263 |
| 2005/0211292 A1 * | 9/2005 | Chittibabu et al. ........... 136/263 |
| 2006/0046149 A1 * | 3/2006 | Yong et al. ..................... 429/251 |
| 2006/0216610 A1 * | 9/2006 | Galvin et al. ................. 429/315 |
| 2006/0292452 A1 | 12/2006 | Utsugi et al. | |
| 2007/0095389 A1 * | 5/2007 | Cho et al. ...................... 136/263 |
| 2008/0286643 A1 * | 11/2008 | Iwasaki ........................ 429/111 |
| 2009/0101863 A1 | 4/2009 | Wu et al. | |
| 2009/0173381 A1 | 7/2009 | Kang et al. | |
| 2009/0311589 A1 | 12/2009 | Kim et al. | |
| 2010/0101628 A1 * | 4/2010 | Poe et al. ....................... 136/244 |
| 2010/0239916 A1 | 9/2010 | Bhattacharryya et al. | |
| 2010/0330268 A1 * | 12/2010 | Jiang ............................. 427/78 |

* cited by examiner

*Primary Examiner* — Edward Tso
*Assistant Examiner* — Alexis A Boateng
(74) *Attorney, Agent, or Firm* — Boyle Fredrickson, S.C.

(57) ABSTRACT

A method and device for harvesting and storing solar energy is provided. The device converts solar energy to electrical energy via the photovoltaic effect. The device includes a pair of electrodes, at least one of which is transparent to allow solar energy to pass through. A medium is disposed between the electrodes which exhibits a combination of photovoltaic and ferroelectric properties. When solar energy passes through the transparent electrode and is received by the medium, electron-hole pairs establish a voltage potential between electrodes in the device via the photovoltaic effect. The voltage potential may be retained and the mobile charge may be stored in the absence of solar energy via the ferroelectric effect.

13 Claims, 3 Drawing Sheets

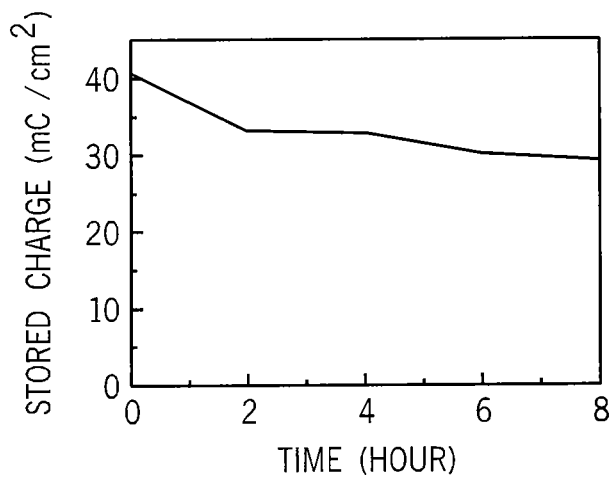
FIG. 6
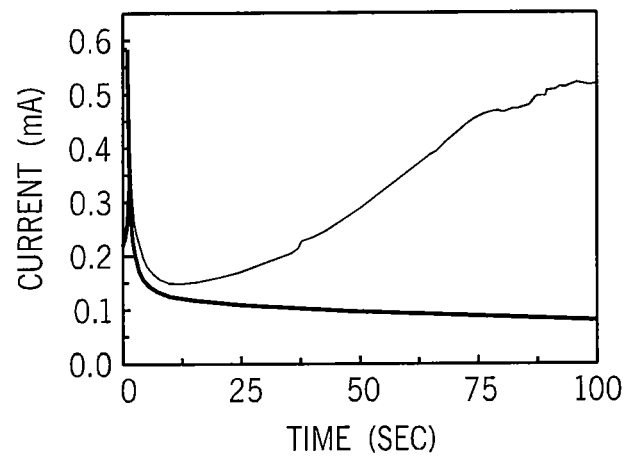
FIG. 7 ——— 500ohm DISCHARGING IN DARK
——— 500ohm DISCHARGING UNDER IRRIDIANCE

PHOTOVOLTAIC CAPACITOR FOR DIRECT SOLAR ENERGY CONVERSION AND STORAGE

REFERENCE TO GOVERNMENT GRANT

This invention was made with government support under 0702095 awarded by the National Science Foundation. The government has certain rights in the invention.

FIELD OF THE INVENTION

The present invention disclosed herein relates generally to photovoltaic devices, and in particular, to a photovoltaic capacitor capable of directly converting solar energy to electrical energy and storing the electrical energy within the device.

BACKGROUND AND SUMMARY OF THE INVENTION

Significant research is being conducted to improve the efficiency and reduce the cost of energy generated by renewable resources. One such renewable energy resource is solar energy. Existing photovoltaic (PV) cells convert solar energy to electrical energy. Solar energy, or light, is composed of photons that strike the surface of the PV cell. However, a portion of the photons that reach the PV cell are reflected and still other photons are absorbed as heat. Only a portion of the photons that reach the PV cell: 1) reach the semiconductor material; and 2) transfer energy from the photon to the semiconductor material such that electrons in the semiconductor material are raised to a sufficiently high energy state that they are free to move within the semiconductor material, thereby generating electricity. Thus, a primary focus of research in PV cells is to improve the efficiency at which the PV cell converts the solar energy into electrical energy.

It is noted that the PV cells cannot directly store the electrical energy generated; therefore, the PV cell must be connected either to a load to immediately utilize the energy or to a storage device, such as rechargeable batteries, for subsequent usage. If the electrical energy is not used or transferred to a storage device, the excited electrons will recombine with the holes in the semiconductor material and the electrical energy is lost. Existing PV cells are, therefore, typically connected to rechargeable batteries such that energy generated but not immediately used by a load is stored for future use. However, the rechargeable batteries add additional cost and complexity in the system. Further, the batteries require extra space and have life cycle limitations. There are also concerns about recycling of old batteries. Thus, it would be desirable to provide a PV cell capable of storing the electrical energy directly in the PV cell without requiring the extra cost and complexity of an external storage device.

Therefore, it is a primary object and feature of the present invention to provide a photovoltaic capacitive device capable of directly harvesting and storing solar energy.

It is a further object and feature of the present invention to improve efficiency and reduce costs of photovoltaic systems by storing electrical energy within the PV cell rather than requiring external storage devices.

In accordance with the present invention, a device is provided for converting solar energy to electrical energy. The device includes a transparent electrode and a second electrode disposed opposite from the transparent electrode. A medium, which includes a semiconductor layer and a membrane layer, is disposed between the transparent electrode and the second electrode. The semiconductor layer may include a dipolar aprotic solvent, ferroelectric particles dissolved in the dipolar aprotic solvent, and semiconductor particles mixed in the solution of ferroelectric particles and dipolar aprotic solvent. The membrane layer may include an anhydrous aprotic solvent, ferroelectric particles dissolved in the anhydrous aprotic solvent, and an electrolyte mixed in the solution of ferroelectric particles and anhydrous aprotic solvent.

In accordance with other aspects of the invention, the transparent electrode may be glass sputtered with conductive indium tin oxide. The second electrode may be glass sputtered with gold. The semiconductor particles may be intrinsic silicon. The electrolyte may include a solution of ethylene carbonate and dimethyl carbonate with lithium hexafluorophosphate dissolved therein. The ferroelectric particles in each of the semiconductor layer and the membrane layer may be polyvinylidene fluoride. The dipolar aprotic solvent of the semiconductor layer may be N-methylpyrrolidinone. The anhydrous aprotic solvent of the membrane layer may be tetrahydrofuran.

In accordance with a further aspect of the present invention, a photovoltaic device for converting solar energy to electrical energy includes a transparent electrode, a second electrode disposed opposite from the transparent electrode, and a medium disposed between the transparent electrode and the second electrode further. The medium includes an electrolyte, semiconductor particles, ferroelectric particles bound with the semiconductor particles, and a membrane disposed on a surface of the second electrode.

In accordance with still another aspect of the present invention, a method is disclosed for storing electron hole pairs generated from light energy in a device. The device has a transparent electrode, a second electrode disposed opposite from the transparent electrode, and a medium disposed between the transparent electrode and the second electrode. The method includes the steps of receiving incident light at the medium through the transparent electrode and generating electron-hole pairs in the medium. The holes are injected into the transparent electrode, and the electrons are stored in the medium such that a voltage potential is established between the transparent electrode and the second electrode. The voltage difference is maintained when the incident light is removed.

In accordance with still yet aspect of the present invention, a method is provided for harvesting and storing solar energy in a device having a transparent electrode, a second electrode disposed opposite from the transparent electrode, and a medium disposed between the transparent electrode and the second electrode. The method includes the steps of generating electron-hole pairs via the photovoltaic effect responsive to solar energy being absorbed within the medium and establishing an ionic concentration gradient in the medium responsive to the electron-hole pair generation. The ionic concentration is maintained within the medium via the ferroelectric effect.

These and other objects, advantages, and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

The drawings furnished herewith illustrate a preferred construction of the present invention in which the above advantages and features are clearly disclosed as well as others which will be readily understood from the following description of the illustrated embodiment.

In the drawings:

FIG. 6 is a graph illustrating storage of mobile charge according to an exemplary embodiment of the invention; and FIG. 7 is a graph comparing operation of a charged device with and without incident light according to an exemplary embodiment of the invention.

DETAILED DESCRIPTION OF THE DRAWINGS

The various features and advantageous details of the subject matter disclosed herein are explained more fully with reference to the non-limiting embodiments described in detail in the following description.

Figure 1:
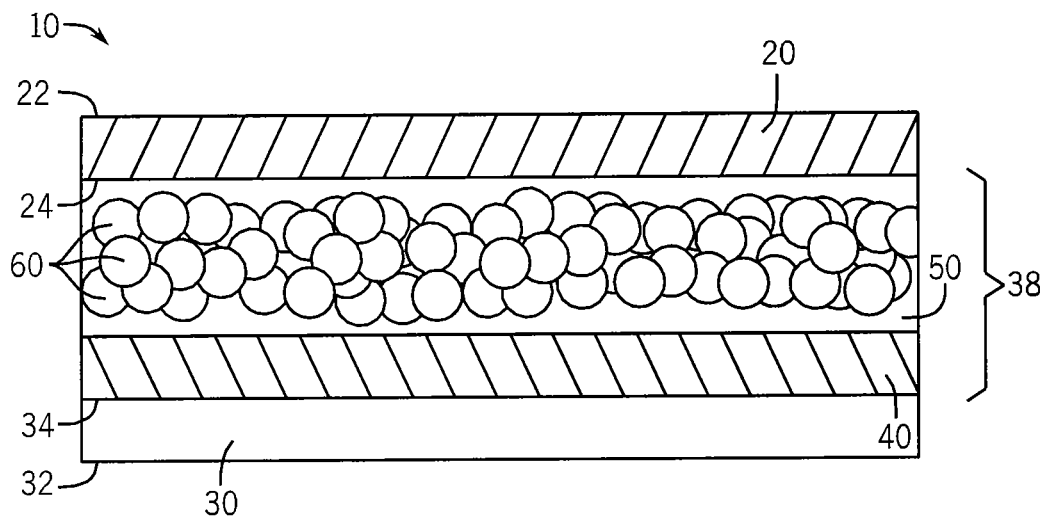
FIG. 1 is a schematic sectional view of one embodiment of the invention.

Referring to FIG. 1, a photovoltaic device 10 in accordance with a first embodiment of the present invention is illustrated. The photovoltaic device 10 includes a transparent electrode 20 having an outer surface 22 and an inner surface 24. The transparent electrode 20 may be made of glass sputtered with an electrically conductive metal-oxide material, for example, indium tin oxide (ITO). A second electrode 30 is disposed opposite of the transparent electrode 20 and includes an outer surface 32 and an inner surface 34. The second electrode 30, also referred to as a current collector, may be glass sputtered with a conductive metal, for example, platinum or gold (Au). A medium 38 is disposed between the inner surface 24 of the transparent electrode 20 and the inner surface 34 of the second electrode 30. The medium 38 includes a membrane layer 40 and a semiconductor layer 50.

The semiconductor layer 50 preferably includes ferroelectric particles dissolved in a dipolar aprotic solvent, such as N-methylpyrrolidinone (NMP), with Silicon (Si) powder added. Suitable ferroelectric particles may be a polyvinylidene fluoride (PVDF) copolymer such as KYNAR FLEX® supplied by Arkema, Inc. An exemplary embodiment of the semiconductor layer 50 is prepared by the following steps. The PVDF copolymer is dissolved in NMP and then Si powder is added. Preferably, the Si powder is added at a nine-to-one (9:1) ratio by mass to the PVDF copolymer. The mixture undergoes ultrasonication for 30 minutes, followed by stirring for 2 hours while the temperature of the mixture is maintained at 55° C. The resulting Si/PVDF slurry is cast onto the inner surface 24 of the transparent electrode 20 dried at 75° C. for 12 hours. The resulting thickness of the composite electrode is approximately 95 μm. It is contemplated that other semiconductor films may be used without deviating from the scope of the invention, including, but not limited to, a film made with titanium oxide.

The membrane layer 40 includes ferroelectric particles, such as a PVDF copolymer, dissolved into an anhydrous aprotic solvent, such as tetrahydrofuran (THF). The resulting solution is added to a parent electrolyte. An exemplary embodiment of the membrane layer 40 is prepared by the following steps. One gram (1 g) of the PVDF copolymer, such as KYNAR FLEX® supplied by Arkema, Inc., is dissolved into ten grams (10 g) of the THF. The parent electrolyte is preferably 0.5M lithium hexafluorophosphate ($LiPF_6$) dissolved into a solution of ethylene carbonate (EC) and dimethyl carbonate (DMC). The solution of EC and DMC is preferably a one-to-one (1:1) ratio by volume. Two and one half grams (2.5 g) of the parent electrolyte is added to the PVDF/THF solution. The resulting slurry is spread onto a glass slide dried for 24 hours, producing a gel with a thickness of about 40 μm. The resulting membrane layer 40 is soaked in the parent electrolyte for 30 minutes prior to assembly of the photovoltaic device 10.

The photovoltaic device 10 may be assembled by placing the membrane layer 40 between the semiconductor layer 50 on the inner surface 24 of the transparent electrode 20 and the inner surface 34 of the second electrode 30. The transparent and second electrodes 20 and 30, respectively, are secured together, for example, by glue or epoxy, thereby retaining the membrane layer 40 therebetween.

Figure 2:
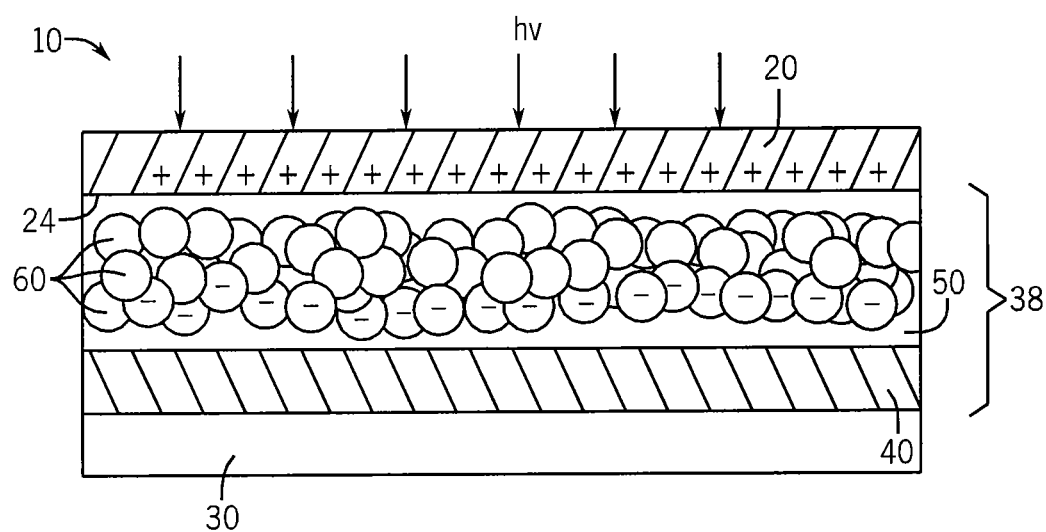
FIG. 2 is the schematic sectional view of FIG. 1, illustrating the operation of the photoelectric device.

In operation, the photovoltaic device 10 receives solar energy, hv, incident on the transparent electrode 20, as shown in FIG. 2. The solar energy, hv, is made up of photons having varying levels of energy as a function of their wavelength. The photons pass through the transparent electrode 20 and are received by the semiconductor layer 50. A portion of the photons are absorbed by the silicon particles 60 in the semiconductor layer 50. Photons that are absorbed by silicon particles 60 and that have the proper wavelength, and hence the appropriate level of energy, cause electrons in the silicon particles 60 to be transferred from the valence band to the conduction band of the silicon particle 60 according to the photovoltaic effect. These electrons are then free to move within the semiconductor layer 50 and, if the photovoltaic device 10 were connected to an electric circuit, to flow through the circuit.

Elevation of the electrons from the valence band to the conduction band generates a corresponding hole in the silicon. The conduction electrons result in negatively charged particles "−" and the holes result in positively charged particles "+". As shown in FIG. 2, the holes are subsequently injected into the ITO on the transparent electrode 20 and the negatively charged particles "−" remain in the silicon particles 60. As long as the photovoltaic device 10 remains exposed to the solar energy, hv, this photovoltaic process continues, establishing a voltage potential across the photovoltaic device. If the photovoltaic device 10 is connected to an electric circuit, the voltage potential would cause electrons to flow from the second electrode 30 returning to the transparent electrode 20 where they could recombine with the holes. If the photovoltaic device 10 is not connected to an electric circuit, the electron-hole pairs are generated until an equilibrium point is reached. At this equilibrium point, the photovoltaic device 10 is considered charged and has reached its maximum open-circuit voltage potential available on the photovoltaic device 10 between the transparent and second electrodes 20 and 30, respectively.

Having established a voltage potential on the photovoltaic device 10, the ferroelectric particles operate to store the mobile charge and maintain the voltage potential once the solar energy, hv, is no longer incident on the transparent electrode 20. Ferroelectric particles become polarized in the presence of an electric field, such as that established by the electron-hole pairs generated in the photovoltaic device 10, and remain polarized when the electric field is removed. As a result, the voltage potential generated via the photovoltaic effect is retained and the mobile charge is stored by a ferroelectric effect when the incident light is removed. Thus, the photovoltaic device 10, as disclosed herein, is capable of directly harvesting and storing solar energy, hv.

Figure 3:
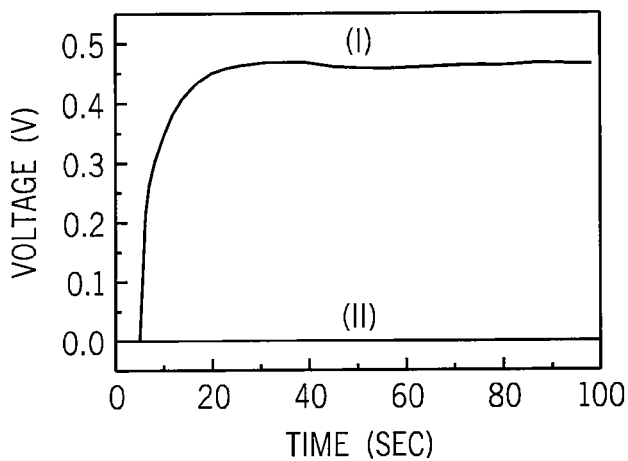
FIG. 3 is a graph illustrating the open-circuit voltage of an exemplary embodiment of the invention during operation.
Figure 4:
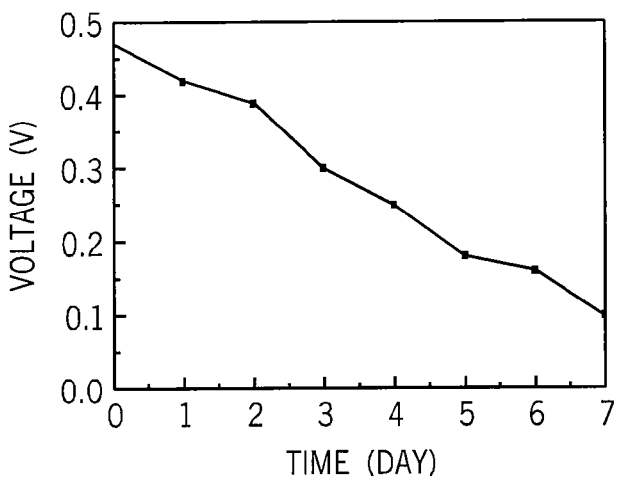
FIG. 4 is a graph illustrating storage capacity of an exemplary embodiment of the invention.

Referring next to FIGS. 3-7, the performance of an exemplary embodiment of the invention is illustrated. A photovoltaic device 10 is assembled as previously described, having a transparent electrode 20 made of glass sputtered with ITO. The semiconductor layer 50 is a film made of intrinsic silicon (or alternatively, p-type silicon, n-type silicon, or titanium oxide), a PVDF copolymer, and NMP. The membrane layer 40 is a PVDF copolymer and THF dissolved in a parent electrolyte, and the second electrode 30 is glass sputtered with Au. A white light source emitting radiance of 1000 watts per square meter is directed toward the transparent electrode 20. As shown in FIG. 3, the open-circuit voltage between the transparent and second electrodes 20 and 30, respectively, increases from 0V to 0.47V in approximately 20 seconds. The open-circuit voltage remains at about 0.47V with subsequent exposure, indicating that the photovoltaic device 10 has reached a charged equilibrium state. After removing the white light source and placing the photovoltaic device 10 in a dark environment, the open-circuit voltage does not drop significantly over the first 24 hours and remains at about 50% of the original value after 4 days, as illustrated in FIG. 4.

Figure 5:
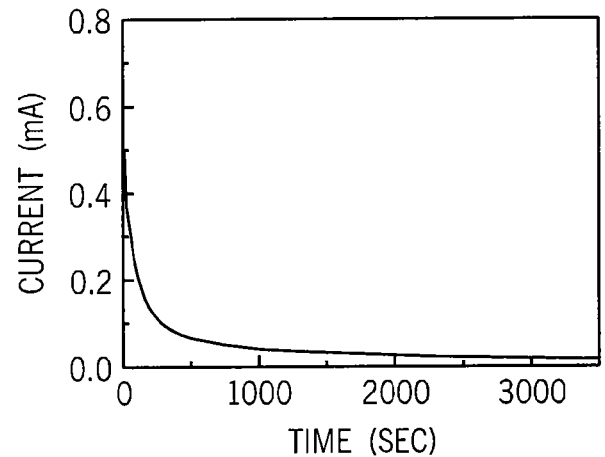
FIG. 5 is a graph illustrating short circuit current output of an exemplary embodiment of the invention.

The amount of mobile charge retained within the photovoltaic device 10 is determined by measuring the current output when short-circuiting the electrodes, 20 and 30, and integrating under the resulting curve, as shown in FIG. 5. The photovoltaic device 10 initially generates 0.75 mA and has a storage capacity of about 37.6 mC/cm$^2$. FIG. 6 illustrates the capacity of the photovoltaic device 10 to retain the mobile charge over time. In addition, the photovoltaic device 10 may both supply current to an electric circuit, if connected, and charge the photovoltaic device 10 simultaneously. FIG. 7 graph compares a discharge cycle of the photovoltaic device 10 with no incident solar energy, hv, present to its ability to supply current to a connected circuit and build charge in the presence of solar energy, hv.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It is also understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. A photovoltaic device for converting solar energy to electrical energy, comprising:
  a transparent electrode for receiving the solar energy thereon;
  a second electrode disposed opposite from the transparent electrode; and
  a medium disposed between the transparent electrode and the second electrode, the medium including a semiconductor layer and a membrane layer disposed between the semiconductor layer and the second electrode;
  wherein:
    the medium being configured to establish a voltage potential between the transparent electrode and the second electrode in response to receipt of the solar energy on the transparent electrode; and
    the medium being configured to maintain the voltage potential between the transparent electrode and the second electrode in response to the absence of the solar energy on the transparent electrode.

2. The photovoltaic device of claim 1 wherein the semiconductor layer further comprises:
  a dipolar aprotic solvent;
  a plurality of ferroelectric particles dissolved in the dipolar aprotic solvent; and
  a plurality of semiconductor particles mixed in the solution of ferroelectric particles and dipolar aprotic solvent.

3. The photovoltaic device of claim 2 wherein the membrane layer further comprises:
  an anhydrous aprotic solvent;
  a plurality of ferroelectric particles dissolved in the anhydrous aprotic solvent; and
  an electrolyte mixed in the solution of ferroelectric particles and anhydrous aprotic solvent.

4. The photovoltaic device of claim 3 wherein the transparent electrode is glass sputtered with conductive indium tin oxide.

5. The photovoltaic device of claim 3 wherein the second electrode is glass sputtered with gold.

6. The photovoltaic device of claim 3 wherein the semiconductor particles are intrinsic silicon.

7. The photovoltaic device of claim 3 wherein the electrolyte further comprises a solution of ethylene carbonate (EC) and dimethyl carbonate (DMC) with lithium hexafluorophosphate dissolved in the solution of EC and DMC.

8. The photovoltaic device of claim 7 wherein the solution of EC and DMC is combined in a ratio of one-to-one by volume.

9. The photovoltaic device of claim 3 wherein the ferroelectric particles in each of the semiconductor layer and the membrane layer are polyvinylidene fluoride.

10. The photovoltaic device of claim 3 wherein the dipolar aprotic solvent of the semiconductor layer is N-methylpyrrolidinone.

11. The photovoltaic device of claim 3 wherein the anhydrous aprotic solvent of the membrane layer is tetrahydrofuran.

12. A photovoltaic device for converting solar energy to electrical energy, comprising:
  a transparent electrode;
  a second electrode disposed opposite from the transparent electrode; and
  a medium disposed between the transparent electrode and the second electrode, the medium including:
    an electrolyte;
    a plurality of semiconductor particles;
    a plurality of ferroelectric particles bound with the semiconductor particles; and
    a membrane disposed on a surface of the second electrode;
  wherein:
    the medium being configured to establish a voltage potential between the transparent electrode and the second electrode in response to receipt of the solar energy on the transparent electrode; and
    the medium being configured to maintain the voltage potential between the transparent electrode and the second electrode in response to the absence of the solar energy on the transparent electrode.

13. The photovoltaic device of claim 12, wherein:
  the transparent electrode is glass sputtered with conductive indium tin oxide;
  the second electrode is glass sputtered with gold;

the semiconductor particles are intrinsic silicon;
the electrolyte further includes a solution of ethyl carbonate (EC) and dimethyl carbonate (DMC) with lithium hexafluorophosphate dissolved in the solution of EC and DC;
the ferroelectric particles are polyvinylidene fluoride; and
the membrane includes polyvinylidene fluoride.

* * * * *